United States Patent
Imaizumi (10) Patent No.: US 10,277,175 B2
(45) Date of Patent: Apr. 30, 2019

(54) SWITCHED-CAPACITOR INPUT CIRCUIT, SWITCHED-CAPACITOR AMPLIFIER, AND SWITCHED-CAPACITOR VOLTAGE COMPARATOR

(71) Applicant: SII Semiconductor Corporation, Chiba-shi, Chiba (JP)

(72) Inventor: Eiki Imaizumi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/442,008

(22) Filed: Feb. 24, 2017

(65) Prior Publication Data

US 2017/0250661 A1 Aug. 31, 2017

(30) Foreign Application Priority Data

Feb. 29, 2016 (JP) .................. 2016-037522

(51) Int. Cl.
| | |
|---|---|
| *H03K 5/24* | (2006.01) |
| *H03F 3/00* | (2006.01) |
| *H03F 3/45* | (2006.01) |
| *H03M 1/40* | (2006.01) |

(52) U.S. Cl.
CPC ......... *H03F 3/005* (2013.01); *H03F 3/45475* (2013.01); *H03K 5/24* (2013.01); *H03F 2203/45514* (2013.01); *H03F 2203/45551* (2013.01); *H03F 2203/45586* (2013.01); *H03M 1/403* (2013.01)

(58) Field of Classification Search
CPC ....................................................... H03F 3/005
See application file for complete search history.

(56) References Cited

U.S. PATENT DOCUMENTS

| | | | | |
|---|---|---|---|---|
| 5,594,445 A | * | 1/1997 | Ginetti ................ | H03M 1/0682 341/162 |
| 5,638,020 A | * | 6/1997 | Koifman ................ | H03F 3/005 327/337 |
| 6,437,608 B1 | * | 8/2002 | Miyabe ................ | G11C 27/026 327/337 |
| 6,909,388 B1 | | 6/2005 | Quiquempoix et al. | |
| 7,002,506 B1 | * | 2/2006 | Tadeparthy ......... | H03M 1/0607 327/94 |
| 8,680,915 B1 | * | 3/2014 | Tsang ...................... | H03F 3/005 330/9 |
| 8,810,283 B2 | * | 8/2014 | Hensley ............... | H03K 17/687 327/534 |
| 8,907,829 B1 | * | 12/2014 | Naderi .................. | H03M 3/496 341/143 |

(Continued)

*Primary Examiner* — Thomas J. Hiltunen
(74) *Attorney, Agent, or Firm* — Brinks Gilson & Lione (57) ABSTRACT

In order to realize a circuit in a subsequent stage with a smaller circuit scale with respect to a single-ended input of a large signal, a double-sampling switched-capacitor input circuit includes a first switched-capacitor input circuit, which includes first capacitors for double sampling, and a second switched-capacitor input circuit, which includes second capacitors for double sampling, and which is configured to operate in opposite phase to the first switched-capacitor input circuit, the double-sampling switched-capacitor input circuit having a configuration in which the first capacitors and the second capacitors have different values, and in which the value of the second capacitors is adjusted so that a signal is attenuated.

4 Claims, 7 Drawing Sheets

(56) References Cited

U.S. PATENT DOCUMENTS

| | | | | |
|---|---|---|---|---|
| 2003/0122592 A1* | 7/2003 | Kawahito | ............ | G11C 27/026 |
| | | | | 327/94 |
| 2003/0210166 A1* | 11/2003 | Liu | ........................ | H03M 3/34 |
| | | | | 341/172 |
| 2006/0279449 A1* | 12/2006 | Pernici | .................. | H03M 3/454 |
| | | | | 341/172 |
| 2007/0103203 A1* | 5/2007 | Makihara | .............. | G11C 27/026 |
| | | | | 327/94 |
| 2007/0236261 A1* | 10/2007 | Draxelmayr | ......... | G11C 27/026 |
| | | | | 327/94 |
| 2010/0066581 A1* | 3/2010 | Ito | ........................ | G11C 27/026 |
| | | | | 341/158 |
| 2012/0161994 A1* | 6/2012 | Quiquempoix | ......... | H03F 3/005 |
| | | | | 341/143 |

\* cited by examiner

SWITCHED-CAPACITOR INPUT CIRCUIT, SWITCHED-CAPACITOR AMPLIFIER, AND SWITCHED-CAPACITOR VOLTAGE COMPARATOR

RELATED APPLICATIONS

This application claims priority under 35 U.S.C. § 119 to Japanese Patent Application No. 2016-037522 filed on Feb. 29, 2016, the entire content of which is hereby incorporated by reference.

BACKGROUND OF THE INVENTION

1. Field of the Invention

The present invention relates to a switched-capacitor input circuit. More particularly, the present invention relates to a switched-capacitor input circuit suitable for low supply voltage operation with respect to a single-ended input of a large signal, and to a switched-capacitor amplifier using the input circuit.

2. Description of the Related Art

Figure 6:
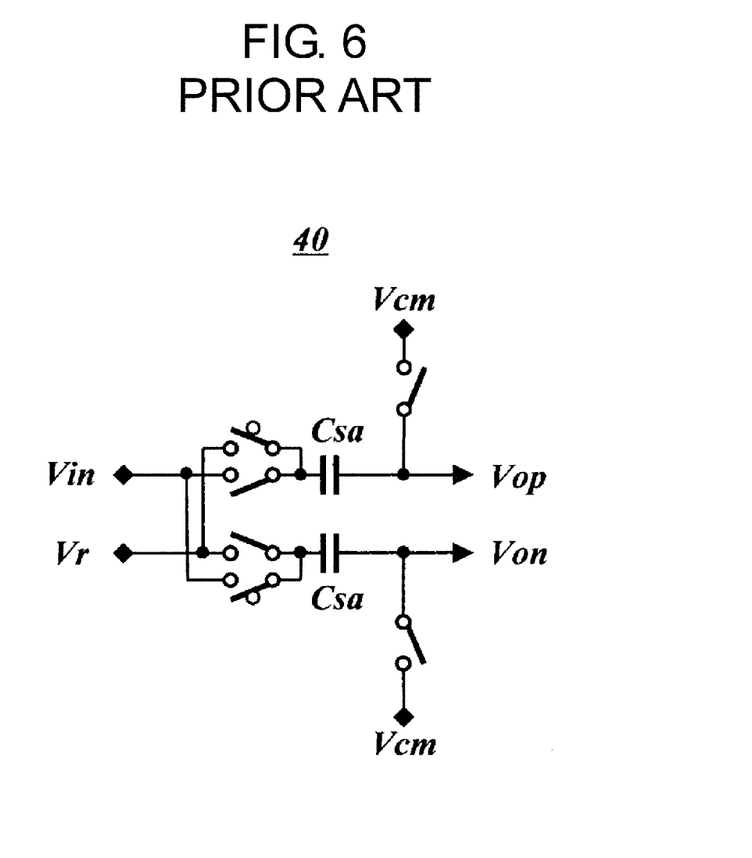
FIG. 6 is a circuit diagram for illustrating a switched-capacitor input circuit according to the related art.

As an input circuit of a switched-capacitor amplifier, which is configured to operate by receiving a single-ended input of a large signal, a double-sampling switched-capacitor input circuit illustrated in FIG. 6 has been known. The switched-capacitor input circuit has an object to facilitate input to a fully differential amplifier by converting the single-ended input signal into differential input signals having a constant common mode voltage.

A switched-capacitor input circuit 40 of FIG. 6 includes switches configured to alternately input signals Vin and Vr, and a set of capacitors Csa configured to sample the signals, and the input signal Vin is sampled with respect to an intended reference voltage Vcm using the reference voltage Vr as a reference. The switched-capacitor input circuit 40 performs double sampling in which, although the common mode voltage of the single-ended input of the large signal varies significantly depending on the input signal, a common mode voltage of differential signals Vop and Von, which are output after the sampling, is kept constant.

First, the inputs Vin and Vr are input to the upper capacitor Csa and the lower capacitor Csa, respectively, and the outputs Vop and Von are biased to a reference voltage Vcm. Next, the outputs Vop and Von are decoupled from the reference voltage Vcm, and Vr and Vin are input to the upper capacitor Csa and the lower capacitor Csa, respectively. As a result, twice a difference voltage between Vin and Vr is output from the output, and the output common-mode voltage becomes the reference voltage Vcm, and is kept constant.

Figure 7:
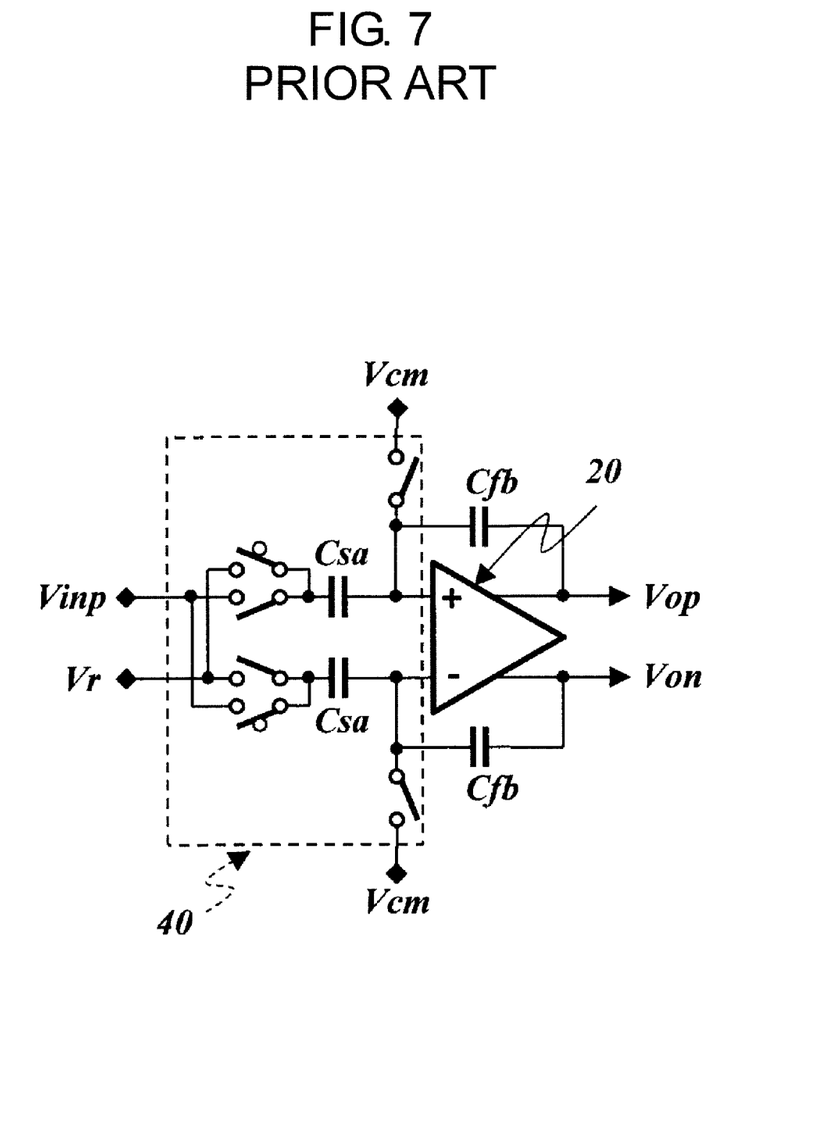
FIG. 7 is a circuit diagram for illustrating a switched-capacitor amplifier using the switched-capacitor input circuit according to the related art.

FIG. 7 is a circuit diagram for illustrating a related-art switched-capacitor amplifier. The related-art switched-capacitor amplifier has the structure in which a fully differential amplifier 20, which includes feedback capacitors between inputs and outputs thereof, is connected to the switched-capacitor input circuit 40. The switched-capacitor amplifier has a gain of 2×Csa/Cfb, which is twice the gain of a general switched-capacitor amplifier that does not use the double-sampling method, and such a switched-capacitor amplifier is suitably used for the purpose of amplifying a micro signal.

However, when an operating supply voltage of an amplifier is small with a large signal input, there is rather a need to attenuate the signal. The attenuation is made possible by making the feedback capacitors of the amplifier larger than the input capacitors Csa. However, when the double sampling method is adopted, the signal is amplified to twice, and hence the feedback capacitors need to be made even larger. Therefore, there is a problem in that the circuit scale becomes larger. Moreover, making the feedback capacitors Cfb larger increases a load on the amplifier, and as a result, a problem also arises in that an operating current is increased.

SUMMARY OF THE INVENTION

It is an object of the present invention to provide a double-sampling switched-capacitor input circuit, which realizes a circuit in a subsequent stage with a smaller circuit scale with respect to a single-ended input of a large signal.

In order to solve the above-mentioned problems, a switched-capacitor input circuit according to one embodiment of the present invention includes a switched-capacitor input circuit 40, which employs a double-sampling method, and a switched-capacitor input circuit 90, which employs the double-sampling method, and which is configured to operate in opposite phase to the switched-capacitor input circuit 40. Double sampling capacitors Csa of the switched-capacitor input circuit 40 and double sampling capacitors Csb of the switched-capacitor input circuit 90 have different values. Then, the value of the capacitors Csb is adjusted so as to attenuate the signal, that is, to obtain a gain of 1 or less.

According to the switched-capacitor input circuit of the present invention, when a switched-capacitor amplifier is formed, the signal may be attenuated without making feedback capacitors large, and hence the feedback capacitors of the amplifier may be reduced in size as compared to the case of the related-art switched-capacitor amplifier. Therefore, the switched-capacitor amplifier may provide the effects of a smaller circuit scale, a reduced load on the amplifier, and reduced power consumption.

DETAILED DESCRIPTION OF THE PREFERRED EMBODIMENTS

Figure 1:
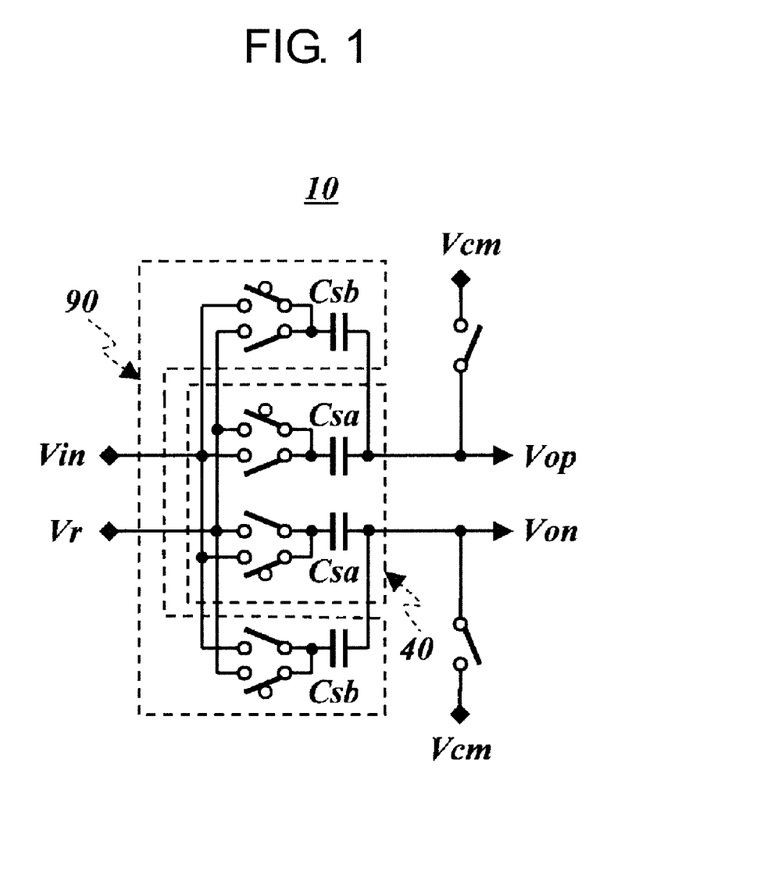
FIG. 1 is a circuit diagram for illustrating a switched-capacitor input circuit according to the present invention.

In FIG. 1, a switched-capacitor input circuit according to an embodiment of the present invention is illustrated.

A switched-capacitor input circuit 10 includes a pair of input terminals, to which an input signal Vin and a reference voltage Vr are input, a pair of output terminals, from which output voltages Vop and Von are output, reference voltage terminals, which are configured to apply a reference voltage Vcm to the respective output terminals, switches connected between respective ones of the reference voltage terminals and respective ones of the output terminals, a switched-capacitor input circuit 40, which employs a double-sampling method, and which is connected between the pair of input terminals and the pair of output terminals, and a switched-capacitor input circuit 90, which employs the double-sampling method, and which is connected between the pair of input terminals and the pair of output terminals.

Sampling capacitors Csa of the switched-capacitor input circuit 40 and sampling capacitors Csb of the switched-capacitor input circuit 90 have different values. Moreover, switches denoted by the same reference symbols are operated to be turned on/off at the same time, and switches denoted by different reference symbols are operated to be turned on/off oppositely. It is ensured that a pair of switches that are operated oppositely is not turned on at the same time.

When the input signal Vin is sampled using the reference voltage Vr as a reference, Vin and Vr are sampled with reference to the reference voltage Vcm by the upper sampling capacitors Csa and Csb, respectively, while Vr and Vin are sampled by the lower sampling capacitors Csa and Csb, respectively. During the holding, the switches connecting the output terminals to the reference voltage Vcm are turned off. Further, Vr and Vin are input to the upper sampling capacitors Csa and Csb, respectively, and Vin and Vr are input to the lower sampling capacitors Csa and Csb, respectively.

A difference voltage between the output terminals is expressed as follows:

$$Vop-Von=-2\{(1-\alpha)/(1+\alpha)\}(Vin-Vr) \quad (1),$$

where $\alpha \equiv Csb/Csa \geq 0$.

In a case where Csb=0, a gain of −2 times is obtained with the related-art switched-capacitor input circuit characteristics. However, when Csb is adjusted to establish the relationship: $0<\alpha<1$, that is, $0<Csb<Csa$, a gain satisfying the relationship: $-2<gain<0$ may be obtained, and the signal may be attenuated more than in the related-art circuit.

Figure 2:
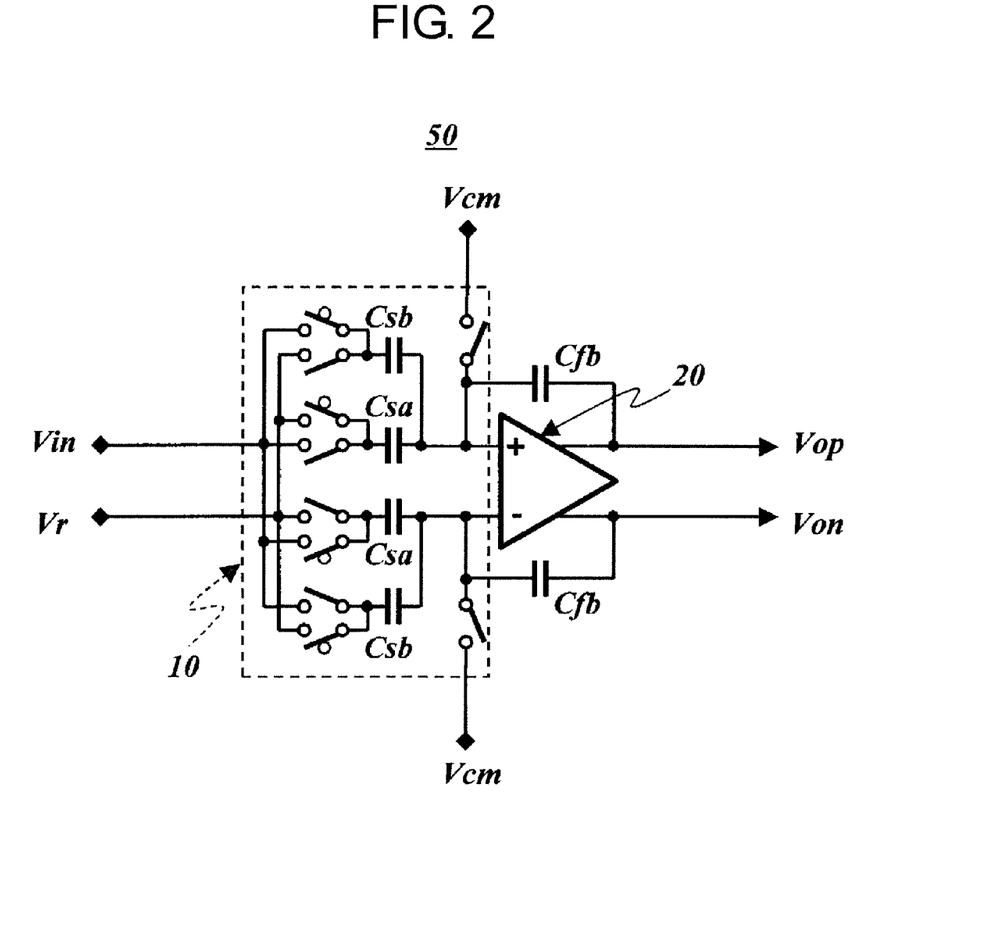
FIG. 2 is a circuit diagram for illustrating a switched-capacitor amplifier using the switched-capacitor input circuit according to the present invention.

In FIG. 2, an example of a switched-capacitor amplifier using the switched-capacitor input circuit 10 is illustrated.

A switched-capacitor amplifier 50 includes the switched-capacitor input circuit 10, a fully differential amplifier 20, and feedback capacitors Cfb connected between respective inputs and respective outputs of the fully differential amplifier 20.

Output difference voltages Vop and Von of the switched-capacitor amplifier 50 establish the following expression:

$$Vop-Von=2(1-\alpha)(Csa/Cfb)(Vin-Vr) \quad (2),$$

where $\alpha \equiv Csb/Csa \geq 0$.

A case where $\alpha=0$ is the related-art switched-capacitor amplifier without the sampling capacitors Csb, and a gain "Gain" becomes:

Gain=2($Csa/Cfb$), which is twice a ratio between the input capacitors and the feedback capacitors because of the double sampling.

In the expression 2, when $0<\alpha<1$, the relationship: $0<1-\alpha<1$ is established, with the result that the gain may be reduced, and that the signal may be attenuated. For example, when $\alpha=\frac{1}{2}$, the following gain may be obtained: Gain=Csa/Cfb, which is half the gain of the related-art switched-capacitor amplifier. Therefore, when the gain is 1 times, and when $\alpha=\frac{1}{2}$, that is, Csb=Csa/2, the expression: Cfb=Csa may be established. Therefore, in the related-art amplifier, the entire capacitors correspond to 6·Csa, and in the case of this embodiment, the entire capacitors correspond to 5·Csa, which is smaller than in the related-art amplifier. When a larger attenuation is to be obtained, the capacitors may be further reduced in size. According to this embodiment, the feedback capacitors of the switched-capacitor amplifier may be reduced in size, with the result that the load on the amplifier may also be reduced, and that the power consumption may be reduced. Moreover, required capacitors may also be reduced in size, and there may be obtained an effect of reducing the circuit scale.

Figure 3:
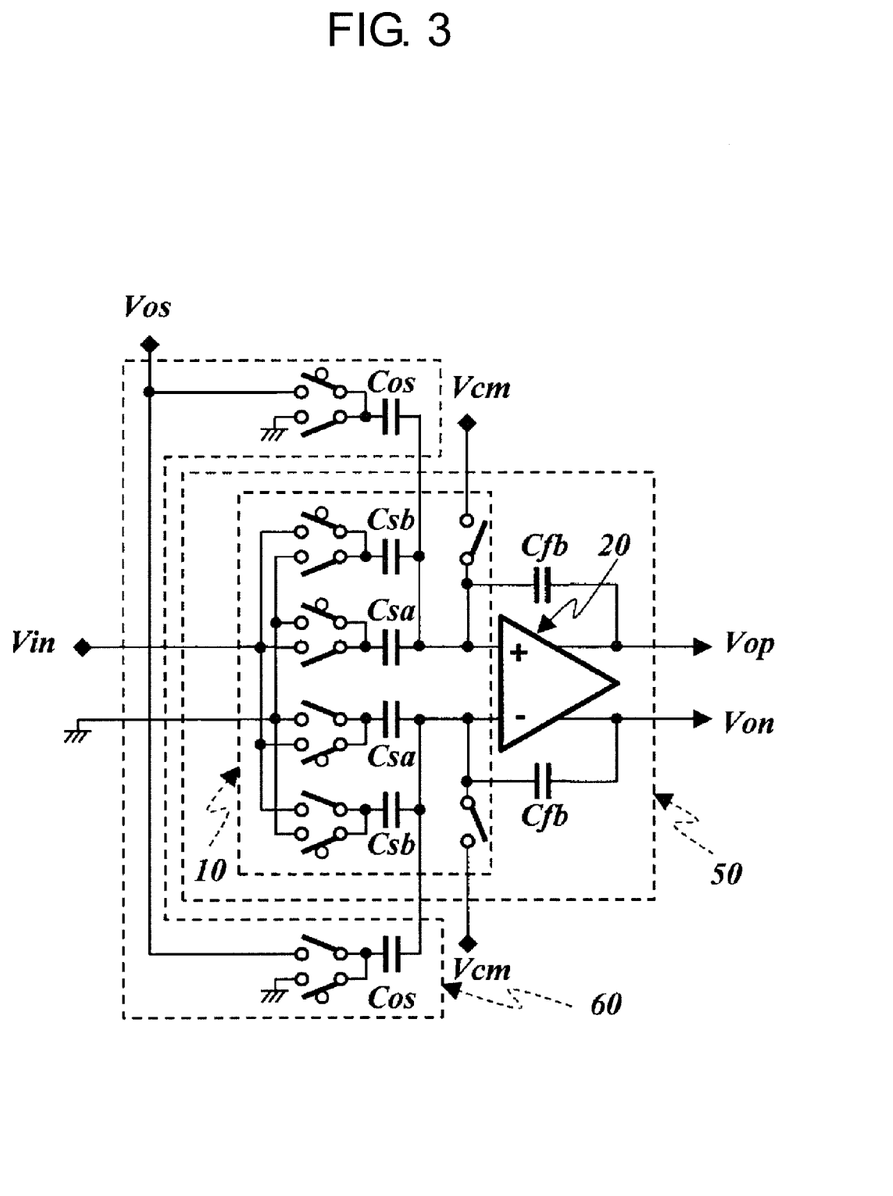
FIG. 3 is a circuit diagram for illustrating another example of the switched-capacitor amplifier using the switched-capacitor input circuit according to the present invention.

FIG. 3 is a circuit diagram for illustrating another example of the switched-capacitor amplifier. The switched-capacitor amplifier according to this embodiment is also intended to shift the level by an intended offset from the input signal Vin with reference to the ground. The switched-capacitor amplifier according to this embodiment includes the switched-capacitor amplifier 50, and a switched-capacitor circuit 60 having an intended voltage Vos for adding the offset to the switched-capacitor amplifier 50. The switched-capacitor circuit 60 includes a pair of sampling capacitors Cos.

Output difference voltages Vop and Von of the switched-capacitor amplifier according to this embodiment satisfy the following expression:

$$Vop-Von=2(Csa/Cfb)\{(1-\alpha)Vin-\beta Vos\} \quad (3),$$

where $\alpha \equiv Csb/Csa \geq 0$ and $\beta \equiv Cos/Csa$.

For example, a comparison is made in a case where the gain is 1 times, and where the same offset is added. When a case where $\alpha=\frac{1}{2}$ and a case where $\alpha=0$, which is the related-art case, are compared to each other, when $\alpha=\frac{1}{2}$, the offset-voltage sampling capacitors Cos are ½ times the related-art case, and the offset sampling capacitors Cos may be also reduced in size as compared to the related-art case.

Figure 4:
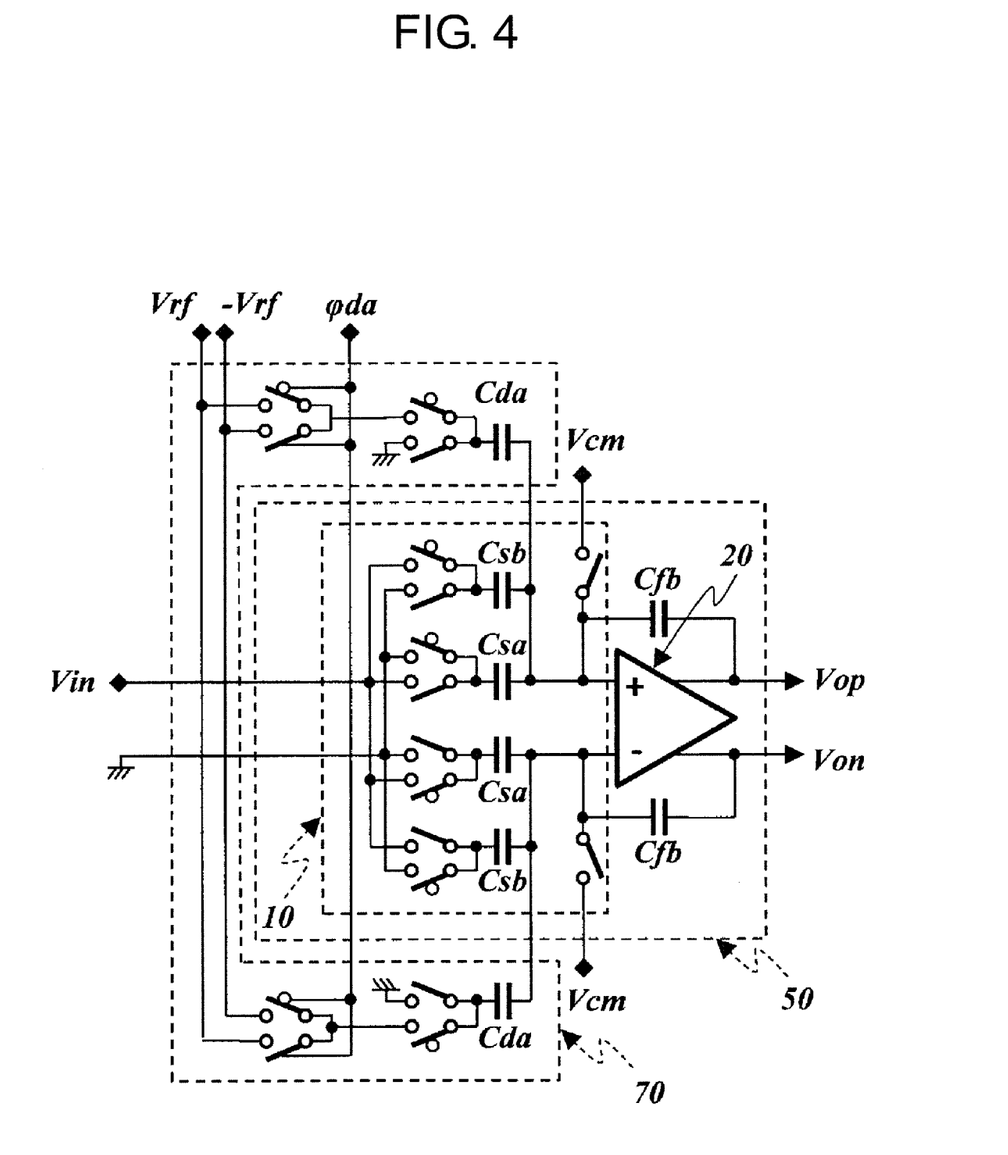
FIG. 4 is a circuit diagram for illustrating still another example of the switched-capacitor amplifier using the switched-capacitor input circuit according to the present invention.

FIG. 4 is a circuit diagram for illustrating still another example of the switched-capacitor amplifier. The switched-capacitor amplifier according to this embodiment includes the switched-capacitor amplifier 50, and a switched-capacitor circuit 70, which is formed of switches and capacitors for realizing a 1-bit capacitor digital-to-analog conversion function. The switched-capacitor circuit 70 includes a pair of sampling capacitors Cda.

Output difference voltages Vop and Von of the switched-capacitor amplifier according to this embodiment establish the following expression:

$$Vop-Von=2(Csa/Cfb)\{(1-\alpha)Vin-\beta DdaVrf\} \quad (4),$$

where $\alpha \equiv Csb/Csa \geq 0$ and $\beta \equiv Cda/Csa$,

Dda=1 when φda is High, and

Dda=−1 when φda is Low.

When $0<\alpha<1$, the signal attenuation is realized, and the capacitors Cda may be reduced in size as compared to the related art.

It is apparent that a switched-capacitor amplifier combining both the offset addition and the digital-to-analog conversion function may also be realized easily by combining both the switched-capacitor circuit 60 for the offset addition and the switched-capacitor circuit 70 for the digital-to-analog conversion function, which are illustrated in FIG. 3 and FIG. 4, respectively.

Figure 5:
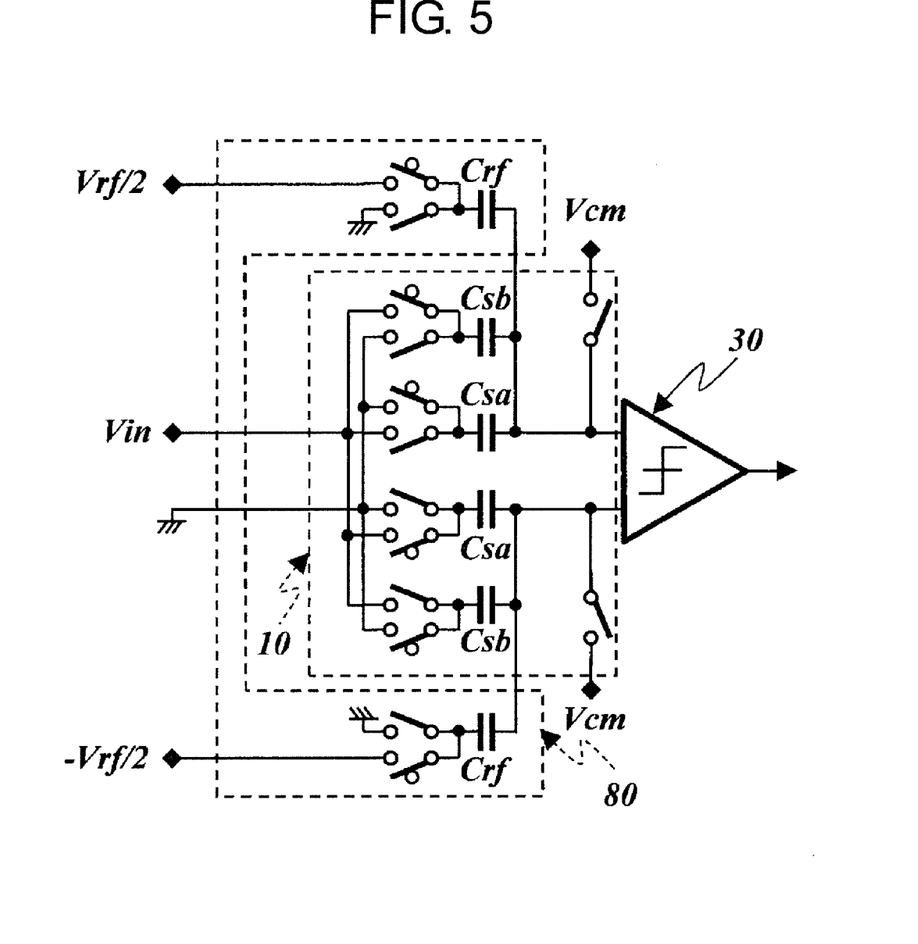
FIG. 5 is a circuit diagram for illustrating a voltage comparator using the switched-capacitor input circuit according to the present invention.

FIG. 5 is a circuit diagram for illustrating a voltage comparator according to this embodiment. The voltage comparator according to this embodiment is a switched-capacitor voltage comparator, which is configured to determine which of an input voltage Vin and a reference voltage Vrf is large or small.

The voltage comparator according to this embodiment includes the switched-capacitor input circuit 10, an input terminal to which a reference voltage Vrf/2 is input, an input terminal to which a reference voltage −Vrf/2 is input, a switched-capacitor circuit 80, to which the reference voltages Vrf/2 and −Vrf/2 are input, and a voltage comparator amplifier 30, to which a combined voltage of the input voltage Vin and the reference voltage Vrf is input, and which is configured to determine "0" or "1" depending on whether the voltage is positive or negative.

An input difference voltage ΔVin to the voltage comparator amplifier 30 is expressed as follows:

$$\Delta Vin = \{2(1-\alpha)Vin + \beta Vrf\}/(1+\alpha+\beta) \quad (5),$$

where $\alpha \equiv Csb/Csa$ and $\beta \equiv Crf/Csa$.

The expression 5 is used to determine which voltage is large or small by whether the numerator is positive or negative.

In the related-art switched-capacitor input circuit 40, when the input signal Vin and the reference voltage Vrf are compared to determine which is large or small, Crf=2*Csa. In contrast, according to the switched-capacitor input circuit 10, for example, when Csb=Csa/2, $\alpha=\frac{1}{2}$, and hence Crf=Csa.

Therefore, when $0 < \alpha < 1$, the signal may be attenuated, and the capacitor Crf may be reduced in size.

According to the switched-capacitor input circuit of the above-mentioned embodiment, in a circuit in a subsequent stage and accompanying circuits of the switched-capacitor input circuit, capacitors required to attenuate the input signal, which is a large signal, may be reduced in size. Therefore, the circuit in the subsequent stage and the accompanying circuits of the switched-capacitor input circuit may be reduced in circuit scale. Moreover, the load on the amplifier in the subsequent stage of the switched-capacitor input circuit may also be reduced, and an effect of reducing the power consumption is obtained.

It has been described that the input signal Vin and the reference voltage Vr are input to the pair of input terminals of the switched-capacitor input circuit 10, but the reference voltage Vr may be an input signal. In other words, a first input signal Vin1 and a second input signal Vin2 may be input to the pair of input terminals of the switched-capacitor input circuit 10.

Moreover, it has been described that the reference voltage Vcm is input to the pair of output terminals of the switched-capacitor input circuit 10, but signals from the output terminals of the fully differential amplifier may be input to the pair of output terminals, respectively.

What is claimed is:

1. A switched-capacitor input circuit, comprising:
   a first input terminal receiving a single input signal;
   a second input terminal receiving a single reference input signal;
   a first output terminal delivering a first output signal;
   a second output terminal delivering a second output signal;
   a first switched-capacitor input circuit configured to employ a double-sampling method, and connected between each of the first input terminal and the second input terminal, and each of the first output terminal and the second output terminal, the first switched-capacitor input circuit including first and second sampling capacitors;
   a second switched-capacitor input circuit configured to employ the double-sampling method, and connected between each of the first input terminal and the second input terminal, and each of the first output terminal and the second output terminal, the second switched-capacitor input circuit including first and second sampling capacitors;
   a first reference voltage terminal configured to apply a first reference voltage to the first output terminal;
   a first switch connected between the first reference voltage terminal and the first output terminal;
   a second reference voltage terminal configured to apply a second reference voltage to the second output terminal; and
   a second switch connected between the second reference voltage terminal and the second output terminal,
   wherein the first and second sampling capacitors of the second switched-capacitor input circuit are respectively connected between the first and second sampling capacitors of the first switched-capacitor input circuit and the first and second output terminals and have a smaller capacity than the first and second sampling capacitors of the first switched-capacitor input circuit, such that the gain of the first and second output signals is attenuated.

2. A switched-capacitor amplifier, comprising:
   the switched-capacitor input circuit of claim 1;
   a fully differential amplifier that includes a pair of input terminals, to which the first output terminal and the second output terminal of the first and second switched-capacitor input circuits are connected; and
   a first feedback capacitor and a second feedback capacitor that are connected between a pair of output terminals and the pair of input terminals of the fully differential amplifier, respectively.

3. A switched-capacitor amplifier according to claim 2, further comprising a switched-capacitor circuit connected to each of the pair of input terminals of the fully differential amplifier, and configured to add and subtract an offset signal.

4. A switched-capacitor voltage comparator, comprising:
   the switched-capacitor input circuit comprising:
   a first input terminal receiving a first input signal;
   a second input terminal receiving a second input signal;
   a first output terminal delivering a first output signal;
   a second output terminal delivering a second output signal;
   a first switched-capacitor input circuit configured to employ a double-sampling method, and connected between each of the first input terminal and the second input terminal, and each of the first output terminal and the second output terminal, the first switched-capacitor input circuit including a first sampling capacitor;
   a second switched-capacitor input circuit configured to employ the double-sampling method, and connected between each of the first input terminal and the second input terminal, and each of the first output terminal and the second output terminal, the second switched-capacitor input circuit including a second sampling capacitor;
   a first reference voltage terminal configured to apply a first reference voltage to the first output terminal;
   a first switch connected between the first reference voltage terminal and the first output terminal;
   a second reference voltage terminal configured to apply a second reference voltage to the second output terminal; and
   a second switch connected between the second reference voltage terminal and the second output terminal, wherein the second sampling capacitor has a smaller capacity than the first sampling capacitor, such that the gain of the first and second output signals is attenuated, a voltage comparator amplifier that includes a pair of input terminals, to which the first output terminal and the second output terminal of the switched-capacitor input circuit are connected; and a switched-capacitor circuit connected to the pair of input terminals of the voltage comparator amplifier, and configured to apply a third reference voltage.

* * * * *